United States Patent
Jayaraman et al.

(12) 
(10) Patent No.: US 6,372,533 B2
(45) Date of Patent: Apr. 16, 2002

(54) METHOD OF MAKING A SEMICONDUCTOR DEVICE WITH ALIGNED OXIDE APERTURES AND CONTACT TO AN INTERVENING LAYER

(75) Inventors: Vijaysekhar Jayaraman, Goleta; Jonathan Geske, Lompoc, both of CA (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 09/805,259

(22) Filed: Mar. 13, 2001

Related U.S. Application Data

(62) Division of application No. 09/186,848, filed on Nov. 5, 1998, now Pat. No. 6,314,118.

(51) Int. Cl.[7] .............................................. H01L 21/20
(52) U.S. Cl. ............................ 438/22; 438/24; 438/35; 438/38
(58) Field of Search ............................. 438/38, 22, 24, 438/28, 34, 42, 43, 44, 47, 46, 35

(56) References Cited

U.S. PATENT DOCUMENTS

| | | | |
|---|---|---|---|
| 5,403,775 A | * | 4/1995 | Holonyak, Jr. et al. ...... 437/129 |
| 5,513,204 A | * | 4/1996 | Jayaraman ................... 372/96 |
| 5,550,081 A | * | 8/1996 | Holonyak, Jr. et al. ........ 438/47 |
| 5,563,094 A | * | 10/1996 | Paoli et al. .................. 437/110 |
| 5,882,951 A | * | 3/1999 | Jewell .......................... 438/22 |
| 5,897,329 A | * | 4/1999 | Jewell .......................... 438/38 |
| 5,903,588 A | * | 5/1999 | Guenter et al. ................ 372/46 |
| 5,991,326 A | * | 11/1999 | Yuen et al. .................... 372/96 |
| 6,048,748 A | * | 4/2000 | Khare et al. .................. 438/39 |

FOREIGN PATENT DOCUMENTS

| | | |
|---|---|---|
| DE | 19523267 | 1/1997 |
| WO | 98/05073 | 2/1998 |
| WO | 98/31080 | 7/1998 |
| WO | 98/39824 | 9/1998 |

OTHER PUBLICATIONS

Lim et al. "Sealing of Alas Against Wet Oxidation and Its Use in the Fabrication of Vertical–Cavity Surface–Emitting Lasers" American Institute of Physics 1997;71(4):1915–1917.

Lott et al., "Vertical Cavity Lasers Based on Vertically Coupled Quantum Dots," Electronics Letters, GB, IEE Stevenage, 1997; 33(13): 1150–1151.

European Search Report EP99308774.

Oh et al. "Comparison of Vertical–Cavity Surface–Emitting Lasers with Half-Wave Cavity Spacers Confined by Single– or Double–Oxide Apertures" IEEE Photonics Technology Letters 1997;9(7):875–877.

* cited by examiner

*Primary Examiner*—Savitri Mulpuri
(74) *Attorney, Agent, or Firm*—Eric J. Sheets; Vic Genco

(57) ABSTRACT

A process for use in fabrication of a semiconductor device is disclosed. The fabricated semiconductor device includes a top oxide aperture within a top oxidation layer and a bottom oxide aperture within a bottom oxidation layer precisely positioned relative to each other, and an electrical contact to a contact layer between the top and bottom oxidation layers. The process includes the following steps: etching past one of the oxidation layers and stopping in the contact layer, etching one or more holes traversing the top and bottom oxidation layers, and simultaneously oxidizing both oxidation layers. Etching past both oxidation layers in the same alignment step ensures that the centers of the two apertures, as formed through selective oxidation, will be aligned. Using this technique in the fabrication of semiconductor devices that include optically pumped vertical cavity surface emitting lasers promotes low-loss refractive index guiding combined with a mechanically robust and reproducibly fabricatable structure. The aligned oxide apertures provide a lateral refractive index profile, which guides the optical energy.

20 Claims, 3 Drawing Sheets

METHOD OF MAKING A SEMICONDUCTOR DEVICE WITH ALIGNED OXIDE APERTURES AND CONTACT TO AN INTERVENING LAYER

CROSS REFERENCE TO RELATED APPLICATIONS

This application is a divisional of application Ser. No. 09/186,848 filed Nov. 5, 1998, now U.S. Pat. No. 6,314,118.

BACKGROUND OF THE INVENTION

1. Field of the Invention

This invention relates to a semiconductor device including a long-wavelength vertical cavity surface emitting laser (VCSEL) that is optically pumped by an integrated short-wavelength VCSEL, and more particularly to a process for use in fabrication of such a semiconductor device.

2. Description of the Related Art

A vertical cavity surface emitting laser (VCSEL) is a semiconductor laser including a semiconductor layer of optically active material, such as gallium arsenide or indium phosphide. The optically active material is sandwiched between mirror stacks formed of highly-reflective layers of metallic material, dielectric material, or epitaxially-grown semiconductor material. Conventionally, one of the mirror stacks is partially reflective so as to pass a portion of the coherent light which builds up in a resonating cavity formed by the mirror stacks sandwiching the active layer.

Lasing structures require optical confinement in the resonating cavity and carrier confinement in the active region to achieve efficient conversion of pumping electrons into stimulated photons through population inversion. The standing wave of reflected optical energy in the resonating cavity has a characteristic cross-section giving rise to an optical mode. A desirable optical mode is the single fundamental transverse mode, for example, the $HE_{11}$ mode of a cylindrical waveguide. A single mode signal from a VCSEL is easily coupled into an optical fiber, has low divergence, and is inherently single frequency in operation.

In order to reach the threshold for lasing, the total gain of a VCSEL must equal the total loss of the VCSEL. Unfortunately, due to the compact nature of VCSELs, the amount of gain media is limited. For efficient VCSELs, at least one of the two required mirrors must have a reflectivity greater than approximately 99.5%. It is more difficult to meet this requirement in long-wavelength VCSELs than in short-wavelength VCSELs because such high reflectivity mirrors are difficult to grow in the same epitaxial step as the long-wavelength active region. Because epitaxially-grown mirror stacks often do not enable sufficiently high reflectivity, some VCSELs are formed by wafer fusing the top and bottom mirror stacks to the active region.

Wafer fusion is a process by which materials of different lattice constant are atomically joined by applying pressure and heat to create a real physical bond. Thus, wafer fusion of one or both of the mirror stacks to the active region is used to increase the reflectivity provided by either or both of the mirrors to compensate for the small amount of gain media so that the lasing threshold can be reached and maintained.

An important requirement for low-threshold, high-efficiency VCSEL operation is a lateral refractive index variation or index guiding mechanism that introduces low optical loss for the VCSEL. Lateral oxidation of AlGaAs has been used for refractive index guiding to make high-efficiency VCSELs. In such a lateral oxidation technique, a mesa is etched into the top surface of the VCSEL wafer, and the exposed sidewalls of an AlGaAs layer are exposed to water vapor. Water vapor exposure causes conversion of the AlGaAs to $AlGaO_x$, some distance in from the sidewall toward the central vertical axis, depending on the duration of oxidation. This introduces a lateral refractive index variation, creating a low-loss optical waveguide if the $AlGaO_x$ layer is sufficiently thin.

A long-wavelength VCSEL can be optically coupled to and optically pumped by a shorter wavelength, electrically pumped VCSEL. U.S. Pat. No. 5,513,204 to Jayaraman entitled "LONG WAVELENGTH, VERTICAL CAVITY SURFACE EMITTING LASER WITH VERTICALLY INTEGRATED OPTICAL PUMP" describes an example of a short-wavelength VCSEL optically pumping a long-wavelength VCSEL.

Two key requirements for manufacturing a long-wavelength VCSEL optically pumped by an integrated short-wavelength VCSEL are precise alignment of the optical mode of the two VCSELs over a wafer scale, combined with electrical contact to both a p-doped layer and an n-doped layer of the short-wavelength VCSEL.

This has been accomplished in the past using patterned wafer fusion to define the optical mode of the long-wavelength VCSEL, while using oxidation to define the optical mode of the short-wavelength pump VCSEL. This necessitates the difficult task of precise, sub-micron infrared photolithography over a full wafer.

SUMMARY OF THE INVENTION

The invention provides a process for use in fabrication of a semiconductor device. In the process, a short-wavelength vertical cavity surface emitting laser (VCSEL) is epitaxially grown on and integrated with a top long-wavelength distributed Bragg reflector. A long-wavelength active region is wafer fused to a bottom long-wavelength distributed Bragg reflector. The top long-wavelength distributed Bragg reflector is wafer fused to the long-wavelength active region, making a long-wavelength VCSEL beneath the short-wavelength VCSEL. The short-wavelength VCSEL includes a top oxidation layer of AlGaAs. The long-wavelength VCSEL includes a bottom oxidation layer of AlGaAs. An n-doped contact layer is interposed between the top oxidation layer of AlGaAs and the bottom oxidation layer of AlGaAs. P-type metal is deposited on a top surface of the short-wavelength VCSEL to make a p-contact of the semiconductor device. A mesa is etched in the short-wavelength VCSEL down to the n-doped contact layer, thereby forming a field around the mesa. N-type metal is deposited in the field to make an n-contact of the semiconductor device. One or more holes are patterned on top of the mesa, radially outward from the p-type metal deposit, in the shape of a non-continuous ring around the p-type metal deposit. The patterned one or more holes are etched from the top of the mesa downward through both the top oxidation layer of AlGaAs and the bottom oxidation layer of AlGaAs, and the one or more etched holes are oxidized in a single step, thereby forming a top oxide aperture in the short-wavelength VCSEL and a bottom oxide aperture in the long-wavelength VCSEL. The top oxide aperture and the bottom oxide aperture are collinear along the central vertical axis of the semiconductor device.

According to an exemplary embodiment of the invention, the fabricated semiconductor device includes a short-wavelength vertical cavity surface emitting laser (VCSEL). The short-wavelength VCSEL includes a top oxidation layer. A long-wavelength VCSEL is monolithically integrated with and optically pumped by the short-wavelength VCSEL. The long-wavelength VCSEL includes a bottom oxidation layer. A top oxide aperture is defined by the top oxidation layer, and a bottom oxide aperture is defined by the bottom oxidation layer. An n-doped contact layer is interposed between the top oxidation layer and the bottom oxidation layer. The semiconductor device presents a central vertical axis, and the top oxide aperture and the bottom oxide aperture are each centered about the central vertical axis in respective planes that are both perpendicular to the central vertical axis.

Other features and advantages of the invention will become apparent from the following detailed description, taken in conjunction with the accompanying drawing, which illustrate, by way of example, the features of the invention.

DETAILED DESCRIPTION

Figure 1:
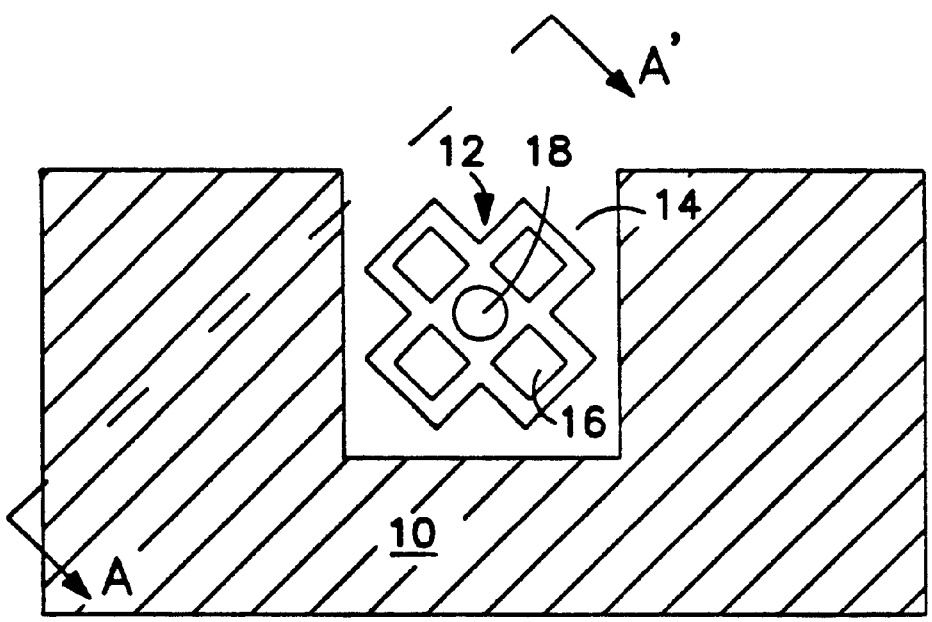
FIG. 1 is a top plan view of a semiconductor device according to the principles of the invention.

In this description, "top" or "upper" are relative terms referring to regions of the semiconductor device away from the substrate, and "bottom" and "lower" mean toward the substrate.

As shown in the drawings for purposes of illustration, a long-wavelength vertical cavity surface emitting laser (VCSEL) is optically coupled to and optically pumped by a short-wavelength VCSEL in a monolithic integrated semiconductor device. Semiconductor devices in accordance with the principles of the invention can be manufactured in groups or arrays in a wafer-scale integrated circuit system.

Successful manufacturing of the monolithic integrated semiconductor device requires the ability to precisely align the optical mode of the two VCSELs over a wafer scale and make electrical contact to both p-material and n-material layers of the short-wavelength VCSEL.

Previous attempts to use patterned wafer fusion to define the optical mode of the long-wavelength VCSEL, and oxidation to define the optical mode of the short-wavelength VCSEL pump, often require precise, sub-micron infrared photolithography over a full wafer, which is difficult.

A better technique than using patterned wafer fusion to define the optical mode of the long-wavelength VCSEL along with oxidation to define the optical mode of the short-wavelength pump is to use a self-aligned process, which does not require manual alignment during processing. In a self-aligned process, a deep mesa is etched past an oxidation layer in each of the two VCSELs. Then the two oxidation layers are simultaneously oxidized. The two oxide apertures in the two oxidation layers, respectively, that result are self-aligned, but there is no way to make electrical contact to a layer between the oxidation layers.

To overcome the aforementioned and other shortcomings, the invention provides a process for use in fabricating a monolithically integrated semiconductor device that includes a long-wavelength VCSEL optically coupled to and optically pumped by a short-wavelength VCSEL. In the fabricated semiconductor device there are two vertically-aligned oxide apertures in the two oxidation layers, respectively, and electrical contact is made to a layer between the two oxidation layers.

The process is described with reference to FIGS. 1 and 2, where a composite-layer semiconductor device has been fabricated from a wafer that includes a plurality of layers. FIG. 1 illustrates a top view of the fabricated monolithically-integrated semiconductor device. With reference to FIG. 1, an n-type metal contact 10 has been deposited on a contact layer of the fabricated semiconductor device. The n-type metal contact 10 surrounds a mesa 12 that has a cloverleaf-shaped cross-sectional configuration. A p-type metal contact 14 has been deposited on the cloverleaf-shaped mesa 12. A set 16 of four deep oxidation holes are defined by the cloverleaf-shaped mesa 12 and extend upward and downward inside the mesa 12. The four deep oxidation holes 16 surround the vertically-aligned top oxide aperture 18 and bottom oxide aperture (not shown in FIG. 1) in the monolithic integrated circuit.

Figure 2:
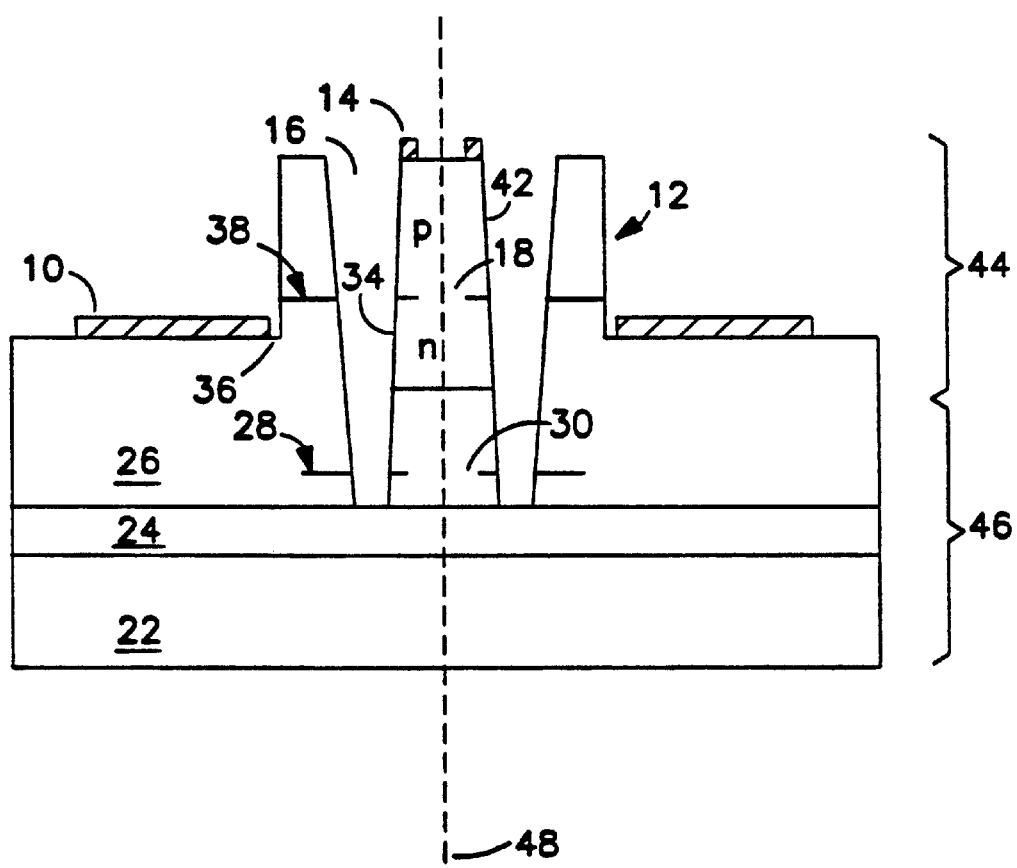
FIG. 2 is an elevational sectional view taken along the line A–A' in FIG. 1.

FIG. 2 illustrates a cross-sectional view taken along the line A–A' in FIG. 1. With reference to FIG. 2, the plurality of layers in the fabricated monolithic integrated semiconductor device includes a bottom 1300 nm mirror 22, a 1300 nm active region 24 disposed above the bottom 1300 nm mirror 22, and a top 1300 nm mirror 26 disposed above the 1300 nm active region 24, where the top 1300 nm mirror 26 includes a bottom oxidation layer 28 that defines the bottom oxide aperture 30 within the bottom oxidation layer 28. The bottom oxidation layer 28 corresponds to the 1300 nm active region 24.

The plurality of layers in the fabricated semiconductor device includes an n-doped bottom 850 nm mirror 34. The n-doped bottom 850 nm mirror 34 is epitaxially grown above the top 1300 nm mirror 26, integrated with the top 1300 nm mirror 26. The bottom 850 nm mirror 34 includes the contact layer 36 of the semiconductor device. The n-type metal contact 10 is applied to the n-doped contact layer 36 and partially surrounds the cloverleaf-shaped mesa 12. The top oxidation layer 38 defines the top oxide aperture 18 and is located above the contact layer 36. The fabricated multilayer semiconductor device includes an 850 nm active region (not numbered in FIG. 2) disposed above the bottom 850 nm mirror 34, and a p-doped top 850 nm mirror 42 disposed above the 850 nm active region.

During fabrication of the semiconductor device in accordance with the principles of the invention, a shallow mesa 12 is etched in the semiconductor wafer down to the contact layer 36 of the n-doped bottom 850 nm mirror 34 that is to be electrically contacted. The exposed area of the contact layer 36 presents a field partially circumscribing the etched mesa 12. The contact layer 36 is located between the top oxidation layer 38 and the bottom oxidation layer 28.

The deep oxidation holes 16 (FIG. 1) are etched from the top of the mesa 12 downward through the mesa 12 beyond both the top oxidation layer 38, which is within the short-wavelength VCSEL 44, and the bottom oxidation layer 28, which is within the long-wavelength VCSEL 46. Four deep oxidation holes 16 are illustrated in the top plan view of FIG. 1. In the sectional view of FIG. 2, two of the four deep oxidation holes are illustrated.

The p-type metal contact 14 is applied to the top of the p-doped top 850 nm mirror 42 of the short-wavelength VCSEL 44. The n-type metal contact 10 is applied on the field of the contact layer 36.

With reference to FIG. 2, current can move in the finished monolithic integrated circuit in a path from the n-type metal contact 10 to the contacting region, in the cloverleaf-shaped mesa structure 12 between the deep oxidation holes, through the top oxide aperture 18 to the p-type metal contact 14.

Simultaneous oxidation of the top oxide aperture 18 and the bottom oxide aperture 30 during fabrication of the monolithic semiconductor device according to the principles of the invention produces an alignment of the optical mode of the long-wavelength VCSEL 46 with the optical mode of the short-wavelength VCSEL 44 in the monolithic semiconductor device.

The bottom oxide aperture 30 defines the optical mode of the long-wavelength VCSEL 46. The top oxide aperture 18 defines the optical mode of the short-wavelength VCSEL 44 and defines, at least in part, the electric current path in the short-wavelength VCSEL 44.

Multiple vertically-aligned oxide apertures corresponding to multiple active regions in epitaxially grown structures can be achieved as taught herein. Referring to FIG. 2, each oxide aperture 18, 30 is disposed in the plane of its respective oxidation layer 38, 28. Each center line that is normal to the plane in which each oxide aperture is disposed and that passes through the center of each oxide aperture is substantially collinear with the other center line(s) in accordance with the principles of the invention. Importantly, the center line of each oxide aperture is collinear with the center line(s) of the other oxide aperture(s) along a common central vertical axis 48 of the semiconductor device.

In the process of fabricating the semiconductor device, each vertically-aligned oxide aperture is formed by converting a semiconductor layer to an insulating, low-dielectric-constant oxide layer through the process of wet oxidation. The resulting oxide apertures are caused to be aligned by etching a hole, or multiple holes, through all oxidation layers and defining the etch mask for this hole, or these holes, in a single alignment step (which is typically a photolithography step). The etch is followed by a single oxidation step which oxidizes all the layers simultaneously.

Precise alignment of the optical modes of the electrically pumped shorter wavelength VCSEL and the longer wavelength VCSEL that is optically pumped by the shorter wavelength VCSEL is an important aspect of manufacturing optically pumped long-wavelength structures. According to previous practice, to align the optical modes of the electrically pumped VCSEL and the longer wavelength VCSEL that it optically pumps, patterned wafer fusion was used to define the long-wavelength aperture and lateral oxidation was used to define the short-wavelength aperture; and then such oxide aperture and such patterned fusion aperture were manually aligned using infrared photolithography. This is a difficult and time-consuming process and the alignment is not always satisfactory.

One better way to align the apertures of the two VCSELs is to simultaneously oxidize an oxidation layer in each VCSEL to create an aperture in each oxidation layer. The apertures generated after selective oxidation are automatically aligned if an etched hole, or multiple holes, traverses the oxidation layers of the 850 nm short-wavelength pump VCSEL and the 1300 nm long-wavelength VCSEL.

Because the etched feature (i.e., the set of deep oxidation holes) is not continuous around the entire circumference of the aperture, a current path exists from p-metal radially inward of the etched holes on top of the structure to n-metal radially outward of the etched holes in an n-layer (i.e., the contact layer) between the two oxidation layers. Using the invented process, one can, with repeatability, create vertically-aligned apertures within the 850 nm short-wavelength pump VCSEL and the 1300 nm long-wavelength VCSEL and still electrically contact both p-material and n-material layers of the 850 nm short-wavelength pump VCSEL.

The process of etching the deep hole, or holes, can be controlled according to the principles of the invention to engineer a difference between the size of the top oxide aperture and the size of the bottom oxide aperture. For example, using the invented process one can intentionally introduce a taper to the side-wall allowing the top of the hole (or holes) to be wider than the bottom of the hole (or holes). When such a taper is introduced, if the top oxide aperture and the bottom oxide aperture are collinear along the central vertical axis of the monolithic integrated semiconductor device, and if the top oxide aperture and the bottom oxide aperture are located in planes that are perpendicular to the central vertical axis, then the radius or size of the bottom oxide aperture measured from the central vertical axis is greater than the radius or size of the top oxide aperture measured from the central vertical axis. In this case, the selective oxidation of identical oxidation layers renders the bottom aperture larger than the top.

Using the invented process one can also engineer the oxidation layers, and the apertures defined within the oxidation layers, by controlling the aluminum composition of the AlGaAs, the thickness of the layers of AlGaAs, the grade thickness, the doping concentration of the oxidation layers, or combinations of such fabrication parameters, or other related parameters. The resulting apertures will still be aligned, but their sizes will no longer be the same.

Also, the number, shape and placement of the holes can be controlled in the invented process to engineer a specific aperture shape.

A specific application of the invention is used in the manufacture of optically pumped long-wavelength VCSELs. The optically pumped structure includes two monolithically-integrated VCSELs. The top VCSEL of the two is electrically pumped to emit laser light at a shorter wavelength. The shorter wavelength laser light that is emitted by the top VCSEL stimulates the bottom VCSEL to emit laser light at a longer wavelength.

Figure 3:
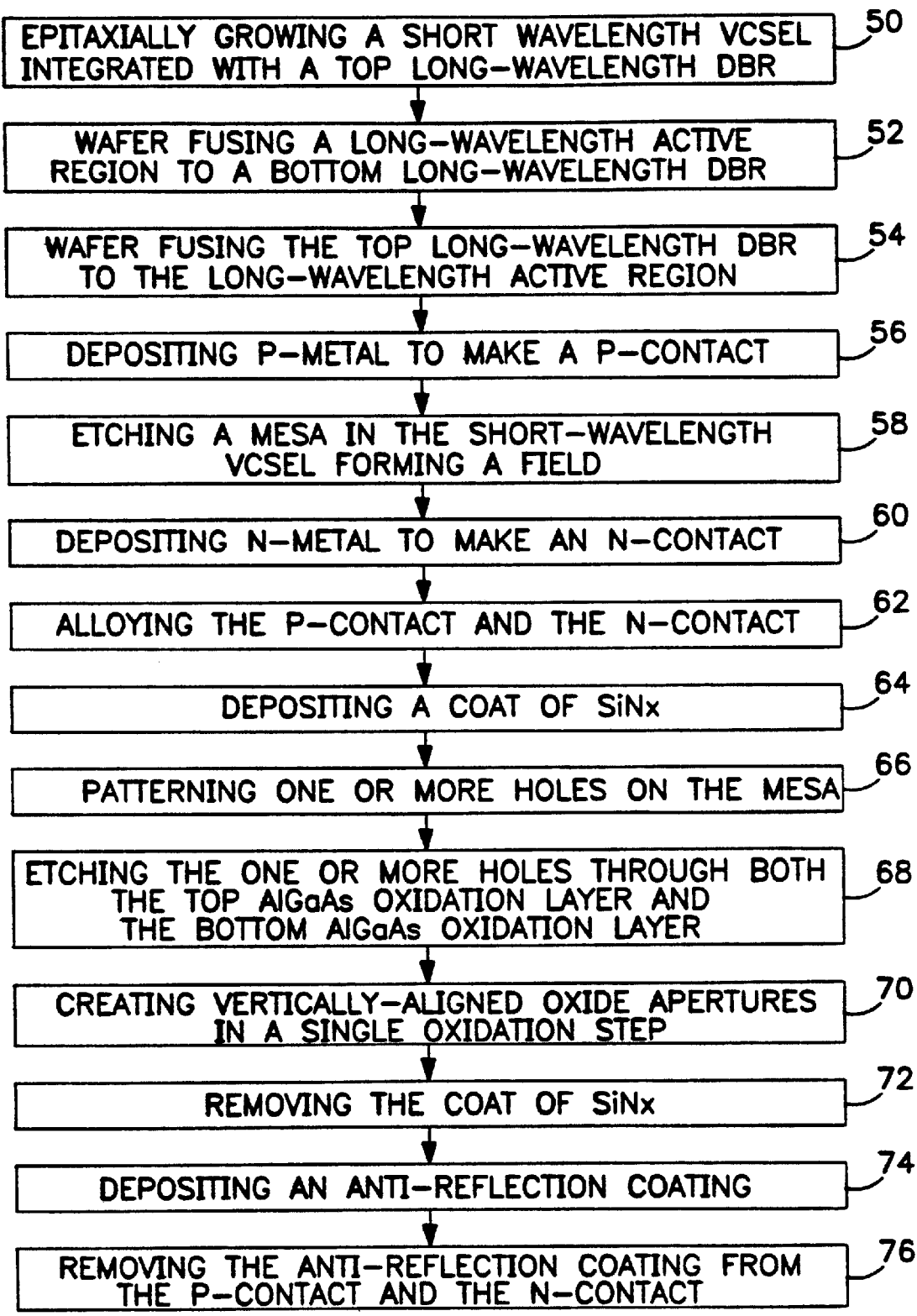
FIG. 3 is a process flow diagram for describing fabrication of a semiconductor device according to the principles of the invention.

FIG. 3 is a process flow diagram for describing fabrication of a semiconductor device in accordance with the principles of the invention. In order to construct a composite-layer semiconductor device in accordance with the principles of the invention, a structure that includes two or more oxidation layers corresponding to two or more active regions is epitaxially grown. Referring to FIG. 3, a specific example of this structure can be made by growing an 850 nm pump laser with an integrated top 1300 nm Distributed Bragg Reflector (DBR) in step 50. A 1300 nm active region is wafer fused to a bottom 1300 nm DBR in step 52. The top 1300 nm DBR is wafer fused to the 1300 nm active region to create a structure suitable for building an optically pumped VCSEL in step 54.

The 850 nm pump VCSEL and integrated top 1300 nm DBR each have a high-percentage AlGaAs layer which can be oxidized selectively with respect to the surrounding epitaxial layers. The n-doped, n-material contact layer of the 850 nm pump VCSEL is situated between the two high-percentage AlGaAs layers. At this stage of the wafer-scale fabrication process, the integrated semiconductor device includes an 850 nm VCSEL optically coupled to an integrated 1300 nm VCSEL beneath the 850 nm VCSEL.

After epitaxially growing the wafer and performing the necessary wafer fusion steps that result in the 850 nm VCSEL optically coupled to the integrated 1300 nm VCSEL, p-metal is deposited on the top surface of the 850 nm pump VCSEL in the wafer to make what will become the top p-type contact of the integrated semiconductor device in step 56.

Then, a mesa, which includes the p-metal deposit on its top surface, is etched in the wafer down to the n-doped contact layer of the 850 nm VCSEL in step 58. This forms a field at least partially circumscribing the etched mesa. The etching can include, for example, a dry plasma based etch or a wet chemical etch. After the mesa etching is completed, n-contact metal is deposited in the etched field in step 60.

Both the p-type metal contact and the n-type metal contact are then alloyed in a rapid thermal annealing process in step 62. There are now completed electrical contacting layers for electrically pumping the 850 nm pump VCSEL of the monolithic integrated circuit.

The terms "p" and "n" as used herein to identify metal-type and doping may be interchanged within the scope of the present invention.

In step 64 the device is then coated with SiNx, which serves to protect both p-type and n-type metal contacts during a subsequent oxidation step, and aids in production of a reproducible vertical sidewall during the subsequent hole etch down through the mesa.

After deposition of the SiNx, one or more holes to be etched are patterned on top of the mesa in step 66. The patterned holes are radially outward of the p-metal deposit, as measured from the central vertical axis. These holes are etched from the top of the mesa down through the SiNx, into the wafer past both the top AlGaAs oxidation layer and the bottom AlGaAs oxidation layer in step 68. The etched holes form a non-continuous ring around the p-metal deposit.

After the holes are etched, a single oxidation step is performed in step 70, which creates in this specific embodiment two vertically-aligned oxide apertures. The bottom oxide aperture confines the optical mode of the 1300 nm VCSEL radially inward toward the central vertical axis and along the central vertical axis. Etching past both the top oxidation layer and the bottom oxidation layer in the same alignment step as taught herein ensures that the centers of the two apertures, after being formed through selective oxidation, will be aligned.

Following the single oxidation step, the SiNx coating is removed by etching in step 72. A thin SiNx coating that serves as a 1300 nm anti-reflection coating is deposited over the device in step 74. The anti-reflection coating is patterned and etched to open access to the 850 nm p-type and n-type electrical contacts in step 76. The anti-reflection coating is maintained over the aperture of the optically pumped device. The device is now complete.

Each monolithically-integrated multi-layer semiconductor device produced by the foregoing process includes a long-wavelength VCSEL optically coupled to and optically pumped by a short-wavelength VCSEL, which in the preferred embodiment is disposed above the long-wavelength VCSEL. It is contemplated that arrays of semiconductor devices can be produced on a wafer scale using the invented process.

The layers of the fabricated semiconductor device include a first oxidation layer, which is part of the short-wavelength VCSEL, and a second oxidation layer, which is part of the long-wavelength VCSEL. A first oxide aperture is defined by the first oxidation layer and a second oxide aperture is defined by the second oxidation layer. The first oxide aperture and the second oxide aperture are vertically aligned with respect to a central vertical axis. An n-type metal contact is applied to a contact layer within the semiconductor device that is interposed between the first oxidation layer and the second oxidation layer.

While several particular forms of the invention have been illustrated and described, it will also be apparent that various modifications can be made without departing from the spirit and scope of the invention.

What is claimed is:

1. A process for use in fabrication of a semiconductor device,
   the fabricated semiconductor device comprising a top oxide aperture defined by a top oxidation layer, a bottom oxide aperture defined by a bottom oxidation layer, and a contact layer adapted for electrical contact and disposed between the top oxidation layer and the bottom oxidation layer,
   the fabricated semiconductor device presenting a central vertical axis, and the top oxide aperture and the bottom oxide aperture are collinear along the central vertical axis, wherein the semiconductor device includes a long-wavelength vertical cavity surface emitting laser (VCSEL) optically pumped by a short-wavelength VCSEL having a wavelength less than said long-wavelength VCSEL, the process comprising the steps of:
   etching past the top oxidation layer and stopping in the contact layer,
   etching one or more holes traversing the top oxidation layer and the bottom oxidation layer, and
   simultaneously oxidizing both the top oxidation layer and the bottom oxidation layer.

2. The process of claim 1, further comprising the step of:
   controlling the size of the top oxide aperture relative to the size of the bottom oxide aperture.

3. The process of claim 2, further comprising the step of:
   controlling the doping concentration of the top oxidation layer and the bottom oxidation layer.

4. The process of claim 2, further comprising the step of:
   controlling the neighboring grade profile for the top oxidation layer and the bottom oxidation layer.

5. The process of claim 2, further comprising the step of:
   controlling the layer thickness of the top oxidation layer and the bottom oxidation layer.

6. The process of claim 2, further comprising the step of:
   controlling layer composition in the top oxidation layer relative to the layer composition in the bottom oxidation layer.

7. The process of claim 1, wherein:
   in the fabricated semiconductor device, the size of the top oxide aperture is different than the size of the bottom oxide aperture.

8. The process of claim 1, wherein:
   the top oxidation layer is within the short-wavelength VCSEL, and
   the bottom oxidation layer is within the long-wavelength VCSEL.

9. The process of claim 1, wherein:
   each of the top oxidation layer and the bottom oxidation layer corresponds, respectively, to an active region.

10. A process for use in fabrication of a semiconductor device that has a central vertical axis, comprising the steps of:
    epitaxially growing a short-wavelength vertical cavity surface emitting laser (VCSEL) integrated with a top long-wavelength distributed Bragg reflector,
    wafer fusing a long-wavelength active region to a bottom long-wavelength distributed Bragg reflector,
    wafer fusing the top long-wavelength distributed Bragg reflector to the long-wavelength active region, making a long-wavelength VCSEL beneath the short-wavelength VCSEL, wherein the short-wavelength VCSEL includes a top oxidation layer of AlGaAs, the long-wavelength VCSEL includes a bottom oxidation layer of AlGaAs, a first contact layer is disposed above said top oxidation layer of AlGaAs, and a second contact layer is interposed between the top oxidation layer of AlGaAs and the bottom oxidation layer of AlGaAs, depositing a first metal on said first contact layer to make a first contact of the semiconductor device, etching a mesa in the short-wavelength VCSEL down to said second contact layer, thereby forming a field around the mesa, depositing a second metal in the field to make a second contact of the semiconductor device, patterning one or more holes on top of the mesa, in the shape of a non-continuous ring, etching the patterned one or more holes from the top of the mesa downward through both the top oxidation layer of AlGaAs and the bottom oxidation layer of AlGaAs, and oxidizing the one or more etched holes in a single step, thereby forming a top oxide aperture in the short-wavelength VCSEL and a bottom oxide aperture in the long-wavelength VCSEL, wherein the top oxide aperture and the bottom oxide aperture are collinear along the central vertical axis.

11. The process of claim 10, wherein:

the etching of the patterned holes through both the top oxidation layer and the bottom oxidation layer is performed in a single step.

12. The process of claim 10, further comprising the steps of:

before the patterning of the one or more holes, depositing a coat of SiNx over the device.

13. The process of claim 12, further comprising the step of:

removing the coat of SiNx, depositing a long-wavelength anti-reflection coating over the device, patterning the anti-reflection coating, and etching the anti-reflection coating to open access to the first contact and the second contact.

14. The process of claim 10, wherein:

each of the top oxidation layer and the bottom oxidation layer can be oxidized selectively with respect to the surrounding epitaxial layers.

15. The process of claim 10, wherein:

the etching of the mesa in the short-wavelength VCSEL uses a dry plasma based etch.

16. The process of claim 10, wherein:

the etching of the mesa in the short-wavelength VCSEL uses a wet chemical etch.

17. The process of claim 10, wherein:

the etched mesa includes the first metal on the top surface of the short-wavelength VCSEL.

18. The process of claim 10, further comprising the step of:

alloying the first contact and the second contact using a rapid thermal annealing process.

19. The process of claim 10, wherein:

the top oxide aperture and the bottom oxide aperture confine the optical mode of the semiconductor device.

20. A process for use in fabrication of a semiconductor device, the fabricated semiconductor device comprising a top oxide aperture defined by a top oxidation layer associated with a top active region and a bottom oxide aperture defined by a bottom oxidation layer associated with a bottom active region, the fabricated semiconductor device presenting a central vertical axis, and the top oxide aperture and the bottom oxide aperture are collinear along the central vertical axis, wherein the semiconductor device includes a long-wavelength vertical cavity surface emitting laser (VCSEL) optically pumped by a short-wavelength VCSEL having a wavelength less than said long-wavelength VCSEL, the process comprising the steps of:

etching one or more holes traversing said top oxidation layer and said bottom oxidation layer, and simultaneously oxidizing both said top oxidation layer and said bottom oxidation layer.

* * * * *